(12) United States Patent
Leduc et al.

(10) Patent No.: US 7,872,841 B2
(45) Date of Patent: Jan. 18, 2011

(54) IN PACKAGE ESD PROTECTIONS OF IC USING A THIN FILM POLYMER

(75) Inventors: Yves Leduc, Roquefort les Pins (FR);
 Nathalie Messina, Nice (FR);
 Charvaka Duvvury, Plano, TX (US);
 Kurt P. Wachtler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 484 days.

(21) Appl. No.: 12/049,726

(22) Filed: Mar. 17, 2008

(65) Prior Publication Data
 US 2008/0278873 A1 Nov. 13, 2008

Related U.S. Application Data

(60) Provisional application No. 60/928,604, filed on May 10, 2007.

(30) Foreign Application Priority Data
 Jan. 25, 2008 (EP) .................................. 08100931

(51) Int. Cl.
 *H02H 9/00* (2006.01)
(52) U.S. Cl. .................... 361/56; 361/91.1; 361/111
(58) Field of Classification Search .................... 361/56, 361/91.1, 111
 See application file for complete search history.

(56) References Cited

U.S. PATENT DOCUMENTS

| | | | | | |
|---|---|---|---|---|---|
| 5,444,593 | A | * | 8/1995 | Allina | 361/56 |
| 7,279,724 | B2 | * | 10/2007 | Collins et al. | 257/103 |
| 7,528,467 | B2 | * | 5/2009 | Lee | 257/659 |
| 2007/0127175 | A1 | * | 6/2007 | Shrier | 361/56 |
| 2009/0257166 | A1 | * | 10/2009 | Kim et al. | 361/111 |

* cited by examiner

*Primary Examiner*—Jared J Fureman
*Assistant Examiner*—Christopher J Clark
(74) *Attorney, Agent, or Firm*—Yingsheng Tung; Wade J. Brady, III; Frederick J. Telecky, Jr.

(57) ABSTRACT

A packaged semiconductor device (200) with a substrate (220) having, sandwiched in an insulator (221), a flat sheet-like sieve member (240) made of a non-linear material switching from insulator to conductor mode at a preset voltage. Both member surfaces are free of indentations; the member is perforated by through-holes, which are grouped into a first set (241) and a second set (242). Metal traces (251) over one member surface are positioned across the first set through-holes (241); each trace is connected to a terminal on the substrate top and, through the hole, to a terminal on the substrate bottom. Analogous for metal traces (252) over the opposite member surface and second set through-holes (242). Traces (252) overlap with a portion of traces (252) to form the locations for the conductivity switches, creating local ultra-low resistance bypasses to ground for discharging overstress events.

20 Claims, 11 Drawing Sheets

IN PACKAGE ESD PROTECTIONS OF IC USING A THIN FILM POLYMER

FIELD OF THE INVENTION

The present invention is related in general to the field of electronic systems and semiconductor devices and more specifically to structure and method of local electrostatic discharge protection built into the package of the devices using a non-linear film.

DESCRIPTION OF RELATED ART

In the ongoing trend of scaling the silicon technologies towards the nanometer range, the ever-present challenge of protection against electrostatic discharge (ESD) and other destructive transient effects, such as cable discharge events, transient latch-ups, and electrostatic overcharge (EOS), has become even more difficult. The shrinking geometries of the integrated circuit (IC) reduce the intrinsic capability of the transistors to handle high ESD currents, and reduce the gate oxide breakdown voltage, but increase the metal resistance under ESD conditions.

Additional ESD challenges are presented by the requirements of high performance/high speed circuits for low leakage and low capacitance of the ESD protection structures; further by the integration, in the same chip, of 5 V USB (Universal Serial Bus) applications with 1.2 V operation (2 nm gate oxide technology); and by the customer demands for external interface IC protection to meet the component-level ESD protection simultaneously with the system-level ESD protection.

The system-level events (IEC, also called Human Metal Model) occur at 4 to 8 kV stress and are equivalent to tens of amps for 1 to 2 µs; integrated over time, their energy-under-the-pulse is thus many times more severe than the common Human Body Model (HBM). The current waveforms of different ESD stress events are compared in FIG. 1, which plots current in amperes (A) as a function of time in nanoseconds (ns). FIG. 1 shows an IEC pulse at 8 kV; the initial spike looks like a Charged Device Model (CDM) event followed by an HBM-like wave at nearly 15 A, representing energy under the pulse much larger than the common component level ESD pulse like the HBM event at 1 kV or 2 kV. Consequently, system-level ESD (IEC), which is important for device pins interfacing with the outside world, requires external protection devices that have to handle currents in the 30 A range for stress levels as high as 8 kV. Other ESD such as Cable Discharge Events (CDE) also introduce very high currents even at 1 kV for longer time periods of 1 µs.

The design of on-chip protection devices in standard technology has been frustrated by the impractical size requirements and the difficulty to make them compatible with circuit functions. For example, external interface pins which require system-level protection may use SCR (silicon controlled rectifier) devices, but they need to be free of latch-up issues during ESD stress; in addition, the large protection devices require wide metal widths for the encountered current densities—consequently, they become impractical.

In present technology, the most common approach to meet the stress challenge is to use an external protection method. Sometimes a dozen of small ESD protection devices are placed on the printed circuit board (PCB) to protect the system from ESD. A well known example of this class of protection is normalized as IEC 61000-4-2, where protection devices are placed around all connectors (battery, battery charger, SIM card, keyboard, microphone, earphone, LCD, USB, etc.) on both faces of the printed circuit board. In summary, an expansive and area-consuming approach.

U.S. Pat. Nos. 6,981,319 and 7,218,492, and U.S. Patent Application Publication 2007/0127175 describe devices and systems for electrostatic discharge suppression based on an electrostatic discharge reactance layer built from a polymer-based suppression material embedded with nanometer-size conducting particles. The material switches from insulating to conducting mode at the high voltages of an overcharge event. The device disclosed in the patents uses electrodes embedded in cavities on either side of the electrostatic discharge reactance layer; the electrodes have extensions, which overlap so that they determine the overall protective performance of the device. The structure of the embodiments, however, has the disadvantages that it does not lend itself to the industry trend of miniaturization and to the market need for fine pitch. Further, the method of fabrication is cumbersome and thus expensive.

SUMMARY OF THE INVENTION

The structure of the prior art has distinct disadvantages. The structural complexity, especially the cavities of the electrostatic discharge layer, does not lend itself to design fine-pitched device terminals; also, the overall protection thickness does not facilitate device miniaturization. Further, the inherent resistance in the range of few hundred mΩ of the protection circuits makes the discharge of the high stress currents in the system-level ESD (IEC) events problematic. In addition, the fabrication method in prior art is cumbersome and thus expensive; it does not lend itself to mass production and low cost.

Applicants' investigations identified a method to protect the multitude of electrodes of an integrated circuit chip against electrical overcharge by assembling the chip onto a substrate, which is structured so that it includes a multitude of local, built-in fine-pitch protection shortcuts to bypass electrical overcharge events directly to ground, before they reach the electrodes. The shortcuts to ground are fine-pitched and exhibit, as measurements have shown, only a few mΩ resistance. They are thus well suited to discharge even the high IEC stress currents found in system-level ESD. The very low resistance compares favorably to the few hundred mΩ resistance inherent in the structures of the existing technology quoted above.

Further, the method for fabricating the substrate with the protection bypasses is low cost. The method lends itself the batch processing and mass production.

In one embodiment of the invention, the substrate has, sandwiched in an insulator, a flat sheet-like sieve member made of a non-linear material that switches from insulator to conductor mode at a preset voltage. The member is perforated with through-holes, otherwise both surfaces of the sheet are free of indentations.

Metal traces over one surface of the sieve member are positioned across a first set of the through-holes; each trace is connected to a terminal on the substrate top and, through the hole, to a terminal on the substrate bottom. Metal traces over the opposite member surface are positioned across a second set through-holes; each trace is connected to a terminal on the substrate bottom and, through the hole, to a terminal on the substrate top. The position of the latter traces overlaps with a portion of the first traces. These overlap areas are the locations for the conductivity switches.

It is a technical advantage that the switch from insulator to conductor mode is practically instant, since it is based on tunneling between nanometer-sized particles embedded in the member material.

The invention employs a flat sheet of the non-linear material, which extends practically throughout the package and can thus protect even the fine-pitched signal and power pins. The solution enabled by the invention saves significant PCB area and is much less expensive than traditional stand-alone protection devices.

The method of the invention is also less expensive than forming cavities in the non-linear material and embedding metal traces for overlaps in the cavities. Due to the minimized electrical paths, the structure of the invention can carry high discharge currents and offers much faster protection than the stacking of chips containing the ESD protections.

Another embodiment of the invention is a method for fabricating a semiconductor device with locally integrated protections against transients. The method includes providing a long tape, with over its whole length and width a thin (about 3 μm) flat sheet of non-linear material sandwiched between two metal layers. The non-linear material switches from an insulator to a conductor at a preset voltage.

The first metal layer is etched to create first traces over the non-linear sheet and gaps between the traces. The second metal layer is etched to create second traces over the non-linear sheet and gaps. The second traces partially overlap with portions of the first traces; the overlap areas are the locations for the conductivity switches.

An insulator foil with a metal layer facing outward is laminated on each of the first and the second trace, filling the gaps between the traces. This creates a flat tape-like substrate for the sites of a plurality of repetitive devices.

Sets of through-holes are drilled into the substrate from top and from bottom through the metal layers and foils to create access to the traces. These through-holes terminate at the traces on the sheet.

To access the first layer traces from the bottom and to access the second layer traces from the top, the through-holes need a set of through-holes in the sheet. Consequently, drilling perforates the sheet with through-holes and turns it into a flat sieve member. Metal (for example, copper) is then deposited to fill the through-holes and to thicken the metal layers.

The thickened metal layers on the substrate top and bottom are etched to create terminals for the metal-filled through-holes. The terminals are distributed, for each device site, between usage for signal and power, and for ground. The selection of the signal and power terminals on the substrate bottom is performed so that the trace, to which each terminal is connected, overlaps with a trace on the opposite surface of the sheet, and that the opposite trace is connected to ground. As a consequence, an electrostatic overcharge that hits the signal/power terminal will readily initiate a local switching of the sheet material to conductor mode and thus bypass the overcharge to ground without giving the transient a chance to damage the corresponding signal/power terminal and the electronic component on the substrate top. This advantage provides protection against transients even for very fine pitch center-to-center of the terminals.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 6 depicts the steps of providing a sheet of non-linear material sandwiched between metal layers, and of providing insulator foils covered with a metal layer.

FIG. 7 depicts the step of patterning the metal layers on the sheet of non-linear material.

FIG. 8 shows the step of laminating the patterned sheet and the foils, forming a substrate.

FIG. 9 depicts the step of opening sets of through-holes into the substrate.

FIG. 10 shows the step of depositing metal to fill the through-holes and to add continuous metal layers.

FIG. 11 depicts the step of patterning the metal layers on both surfaces of the substrate to create terminals.

FIG. 12 shows the steps of attaching connections (bonding wire and solder bodies) to the substrate terminals, and of defining the local bypasses to ground.

DETAILED DESCRIPTION OF THE PREFERRED EMBODIMENTS

Figure 1:
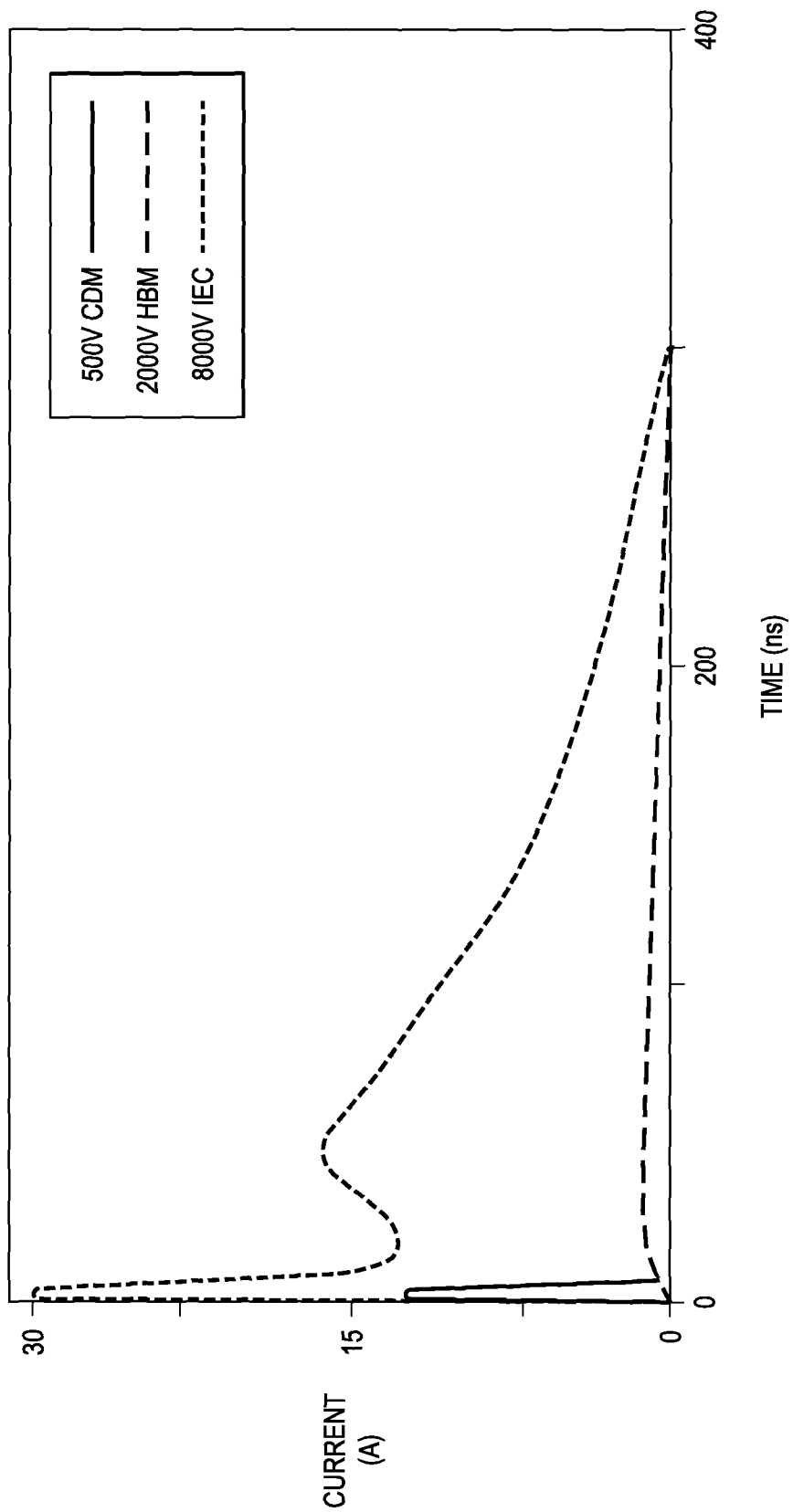
FIG. 1 is a plot of current in amperes (A) as a function of time in nanoseconds (ns) to compare waveforms of different electrostatic discharge (ESD) stress events. Human Body Model (HBM) and Charge Device Model (CDM) are used to test at the component level; system level events (IEC) are used to test at the system level.
Figure 2:
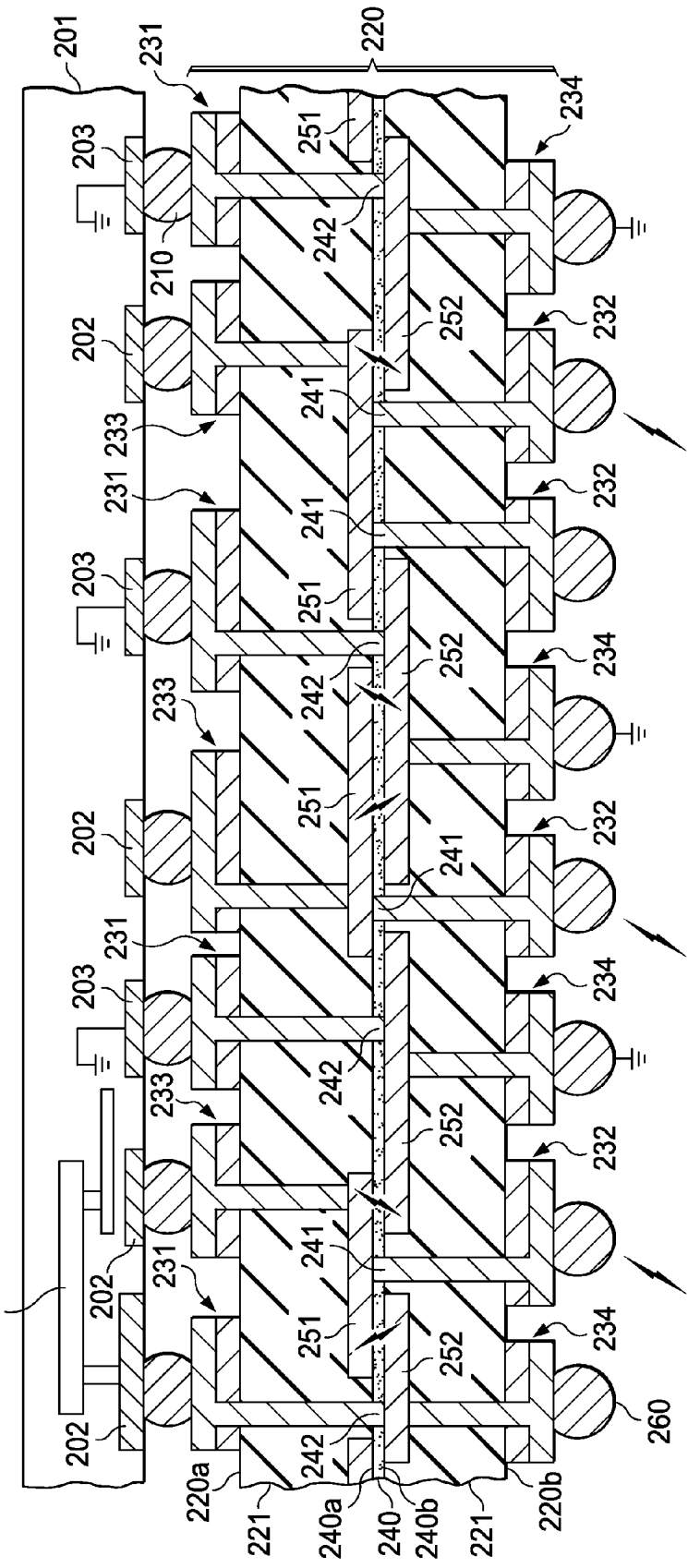
FIG. 2 shows a schematic cross section of a device portion including an electronic component assembled on a substrate fabricated according to the invention. The substrate has, sandwiched in an insulator, a flat sheet-like sieve member made of a non-linear material, which switches from insulator to conductor mode at a preset voltage.

FIG. 2 illustrates a schematic cross section of an embodiment of the invention, which is an electronic device generally designated 200 with protection against transients. Device 100 includes an electronic component 201 connected by solder bodies 210 to a substrate 220. Component 201 may be a semiconductor chip, or may be another device in need for protection against electrostatic discharge, system level transients, cable discharge events, transient latch-ups, or any other electrostatic overcharge events. As FIG. 2 shows, chip 201 has metallic electrodes for external connections. According to their electrical function, the electrodes are grouped in sets: First electrodes 202 serve electrical signal and power, and second electrodes 203 serve electrical ground potential (or supply/ground; zero power being equivalent to ground). One of the first electrodes is schematically shown with its own protection device 204.

FIG. 2 also shows a substrate 220, onto which the component 201 is assembled, and which has built-in local ESD protection shortcuts for the first electrodes 202. The shortcuts are integral with the substrate and are operable to bypass electrical overcharge events directly to ground. Substrate 220 includes insulator material 221 (such as epoxy glass, ABF, etc.) preferably in the thickness range from about 20 to 60 μm. For some devices it may be thinner or thicker, but driven by handheld and wireless product applications, the overall industry trend is towards thinner thicknesses. Substrate 220 has a top surface 220a and a bottom surface 220b. Both top and bottom surfaces have metallic terminals grouped in sets: Top surface 220a has first set terminals 231 and third set terminals 233; and bottom surface 220b has second set terminals 232 and fourth set terminals 234.

Substrate 220 further includes a flat sheet-like sieve member 240 sandwiched in the insulator 221. Sieve member 240 extends throughout the length and width of the device. Sieve member 240 is made of a non-linear material, an insulating polymer compound embedded with nanometer-size conducting particles. The compound switches from insulator to conductor mode at a preset voltage, which is mainly determined by the member thickness. For device 200 in FIG. 2, the member 240 is flat and sheet-like in the thickness range between about 3 and 10 μm.

Comparing to known technology, a substrate according to the method of this invention enables the thickness of the sheet to be reduced by about one order of magnitude and still provide adequate ESD protection to the electronic component. The non-linear material is commercially available in industry from, for example, Electronic Polymers, Inc., Round Rock, Tex., U.S.A.

Sieve member 240 has a first surface 240a and a second surface 240b. Both surfaces are free of indentations such as cavities, grooves and trenches so the process of forming a substrate is much simplified comparing to known technology. As FIG. 2 illustrates, sieve member 240 is perforated by through-holes, which are grouped in sets: first set through-holes are designated 241; second set through-holes are designated 242.

Figure 3:
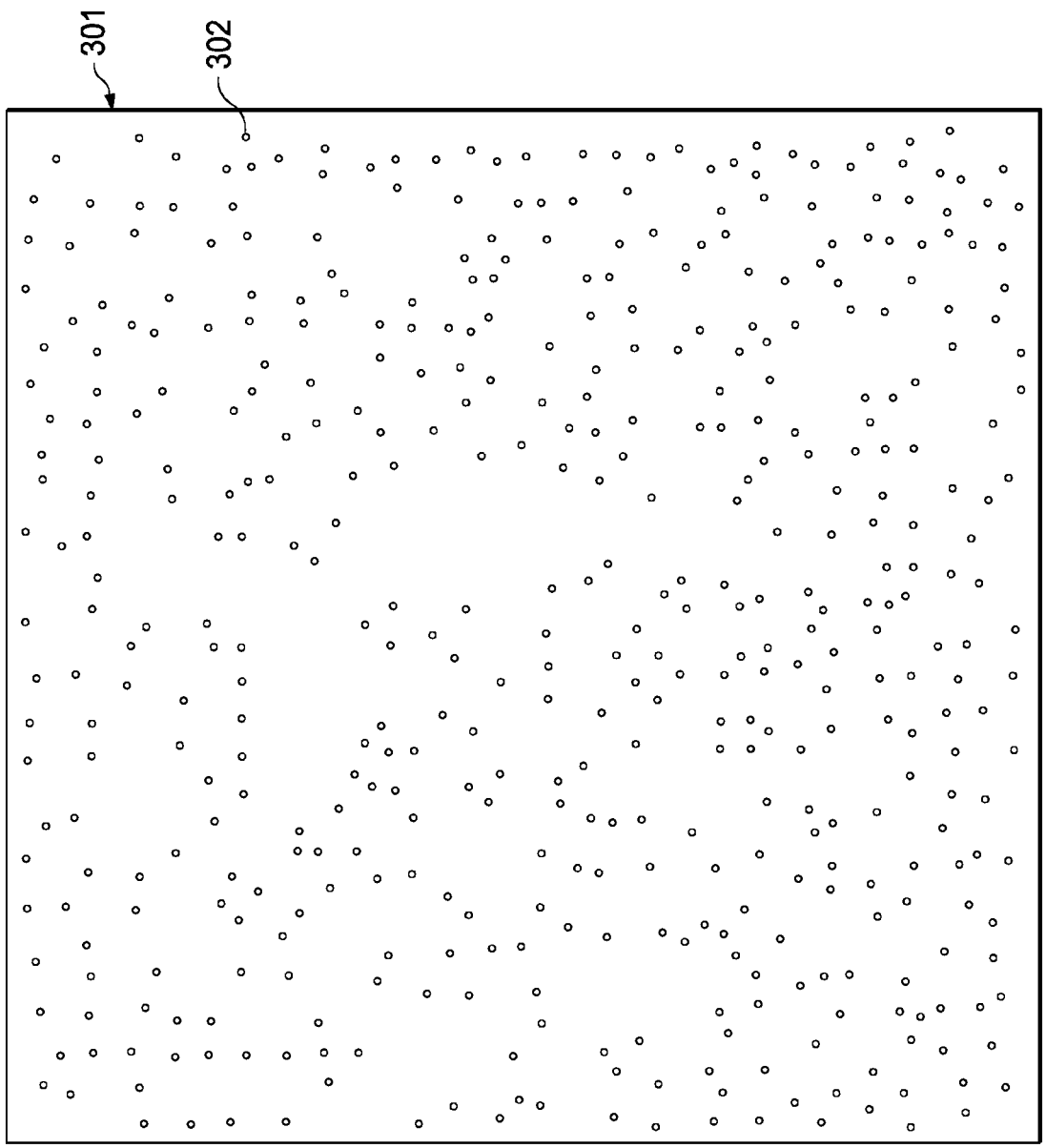
FIG. 3 is a top view of the flat sieve member of an actual semiconductor device of about 12 by 12 mm side length. The diameter of a through-hole is about 80 μm.

Referring to FIG. 3, the flat sheet-like sieve member 301 of an actual semiconductor device is depicted in top view in order to illustrate an example of the high number of through-holes 302, and the extension of the member over the entire length and width of the device. The actual size of the square-shaped sieve member in this example is 12 by 12 mm, and the diameter of the through-holes is about 80 μm. In other devices, the through-holes may have preferred diameters between about 80 to 150 μm. The number and distribution of the through-holes depends on the number and position of device terminals to be protected against ESD events.

On the first surface 240a of sieve member 240 are first metal traces 251, preferably made of copper in the thickness range from about 10 to 25 μm. Each trace 251 is positioned across a first set through-hole 241 through sieve member 240. Further, each trace 251 has a conductive connection to a third set terminal 233 on the first substrate surface 220a, and, through the respective first set through-hole 241, a conductive connection to a second set terminal 232 on the second substrate surface 220b. In other words, both the connection to the third set terminal 233 and the connection to the second set terminal 232 terminate at trace 251.

On the second surface 240b of sieve member 240 are second metal traces 252, preferably made of copper in the thickness range form about 10 to 25 μm. Each trace 252 is positioned across a second set through-hole 242 through sieve member 240 so that trace 252 partially overlaps with a portion of at least one first trace 251. The overlap areas are the locations for the conductivity switches described above, which provide the local bypass to ground for transient events. Further, each trace 252 has a conductive connection to a fourth set terminal 234 on the second substrate surface 220b, and, through the respective second set through-hole 242, a conductive connection to a first set terminal 231 on the first substrate surface 220a. Again, both the connection to the fourth set terminal 234 and the connection to the first set terminal 231 terminate at trace 252.

FIG. 2 depicts a flip-chip attachment of a component 201 onto substrate 220. Solder bodies 210 connect first electrodes 202 and second electrodes 203 of component 201 with the first set terminals 231 and the third set terminals 233 of substrate 220. The connection is so that each first electrode 202 is protected by a low-resistance local bypass built into the substrate 220, which discharges any transient pulse to ground by switching the conductivity of the non-linear material between the overlapping traces.

Solder bodies 260 may be used to connect the second set terminals 232 to external electrical signal and power, and to connect the fourth set terminals 234 to external electrical ground. Instead of the solder bodies 210 or the solder bodies 260, wire bonding, pressure contacts, or other interconnection means may be used for achieve electrical connection. When bonding wires are used, it is preferred to also employ an encapsulation material such as a molding compound in order to protect the wires and the component.

Figure 4:
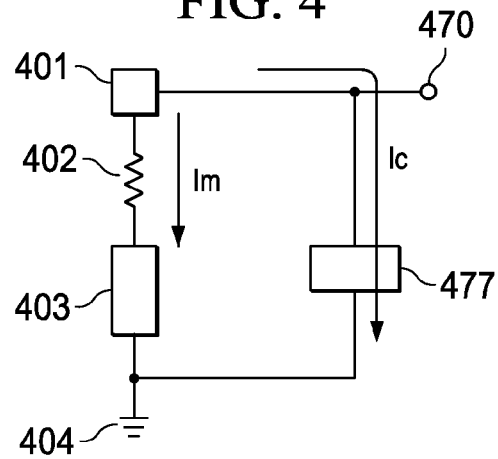
FIG. 4 is a simplified circuit diagram illustrating the application of the member of FIG. 3 for effective ESD protection.
Figure 5:
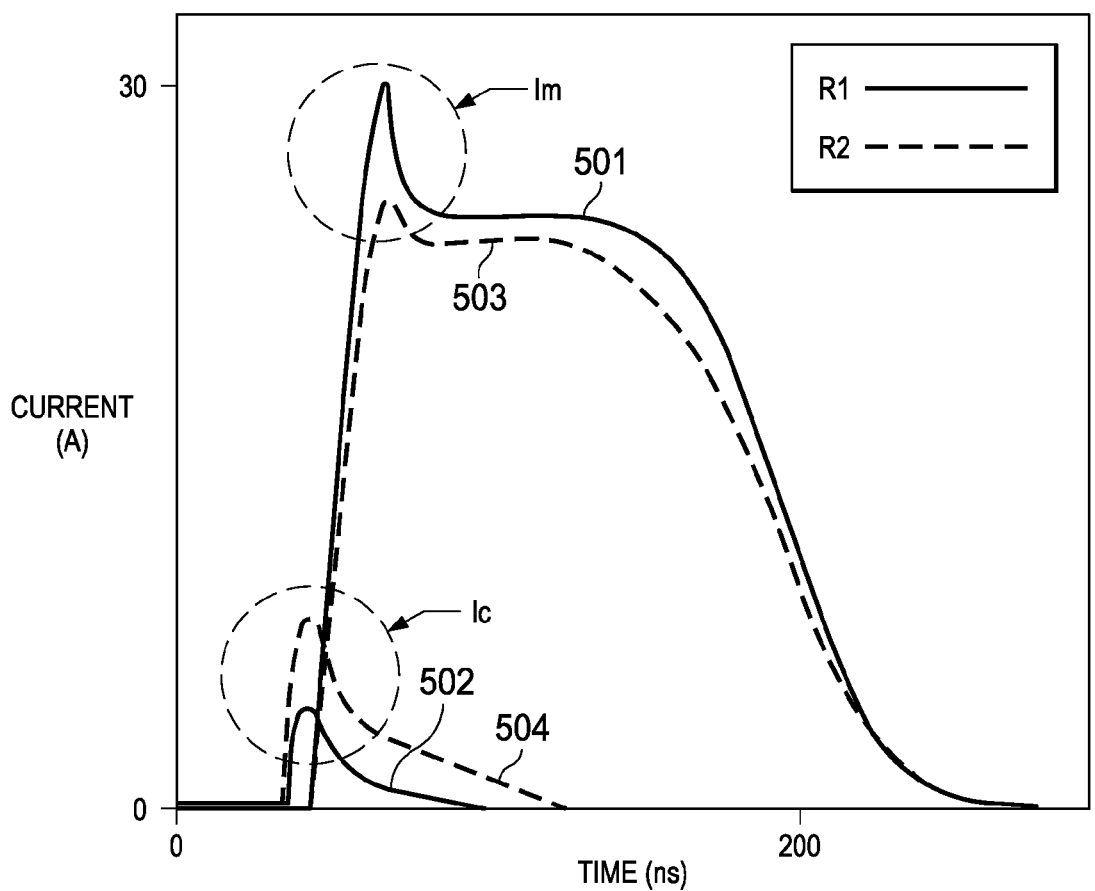
FIG. 5 is a plot of current in amperes (A) as a function of time in nanoseconds (ns) to illustrate the advantage of the present invention to discharge an IEC overcharge event effectively to ground using the ultra-low resistance of a local bypass built into the substrate.

FIG. 4 and FIG. 5 illustrate the impact of an ultra-low resistance of the local bypass to shortcut the impinging transient pulse to ground before it can endanger a component. In FIG. 4, a substrate terminal designated 401 is connected through path resistance 402 to the non-linear overcharge suppression material 403 and ground 404. When an electrostatic pulse strikes terminal 401, a peak current $I_m$ flows through the path resistance 402 and the conducting non-linear material 403 to ground 404. Terminal 401 is connected to component/chip electrode (I/O) 410. For illustration purposes, the I/O also has a conventional clamp 411, which is connected to ground 404. Clamp 411 has a resistance, which allows a current $I_c$ to flow to ground 404.

FIG. 5 plots current in amperes (A) through both paths as a function of time in nanoseconds (ns) for two resistances. In the solution of the present invention, the ultra-low resistance of the local bypass puts the value of path resistance 402 in the range of few mΩ ($R_1$ about 2 to 20 mΩ). The current follows the high-energy curve 501 in FIG. 5 for the bypass, with $I_m$ around 30 A, and the low-energy curve 502 for the I/O clamp, with $I_c$ only about 4 A. In contrast, the solution of the known technology puts the value of the path resistance 402 in the range over 100 mΩ ($R_2$ between about 0.1 and 2Ω). In such case, the current follows curve 503 for the connection to ground, with $I_m$ about 20 to 25 A, but the current 504 through the I/O clamp is considerably more stressful with $I_c$ about 10 A, which is more likely to damage the electronic component on the substrate.

Figure 6:
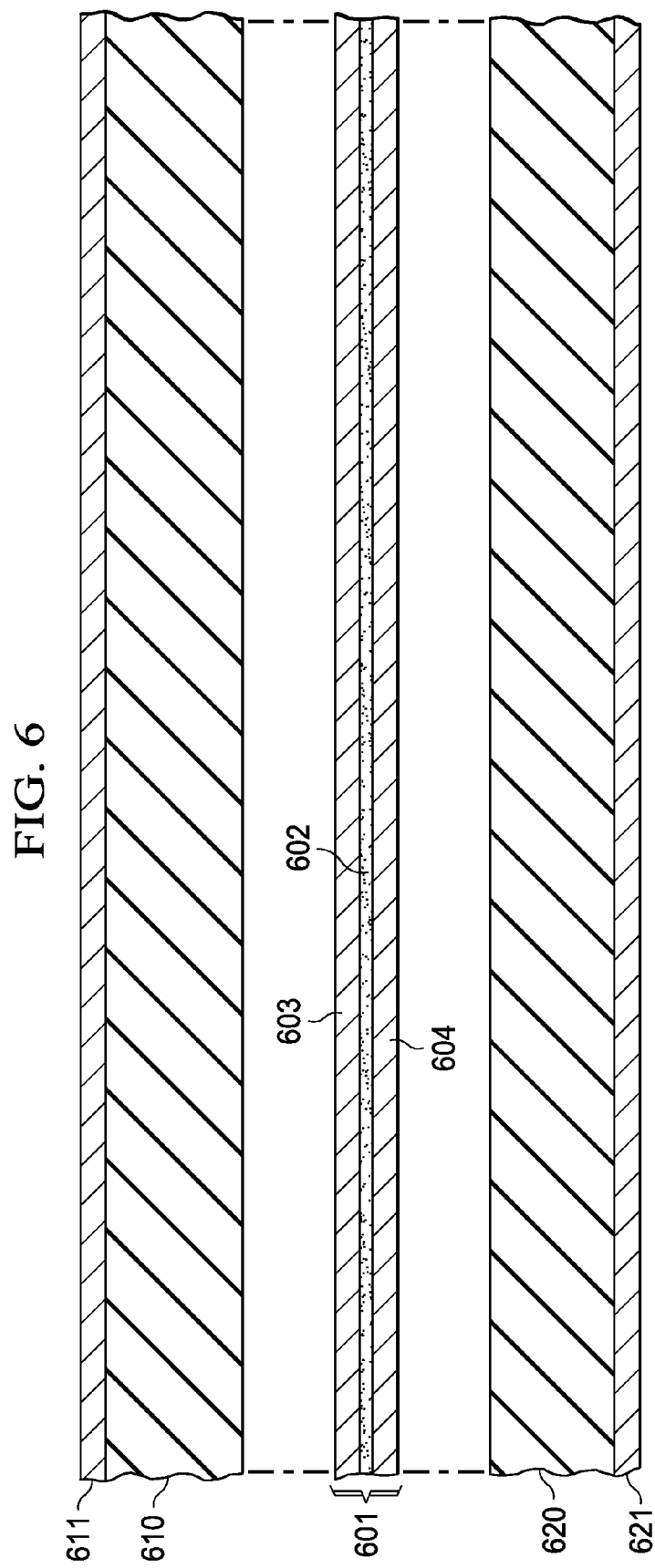
FIG. 6 to FIG. 12 show schematic cross sections to illustrate certain process steps of a method for fabricating a semiconductor device with ESD protection according to the invention.

Another embodiment of the present invention is a method for fabricating a semiconductor device with protection against transient pulses. The method starts with providing a flat tape 601 as depicted in FIG. 6. The tape includes a sheet 602 of a non-linear material sandwiched between a first metal layer 603 and a second metal layer 604. The non-linear material is an insulating polymer compound embedded with nanometer-size conducting particles that allow the material to switch from insulator to conductor mode at a preset voltage. Sheet 602 is preferably between 3 and 10 µm thick. Metal layers 603 and 604 are preferably copper in the thickness range from about 25 to 100 µm. The sheet and the metal layers extend over the entire tape length and width.

Figure 7:
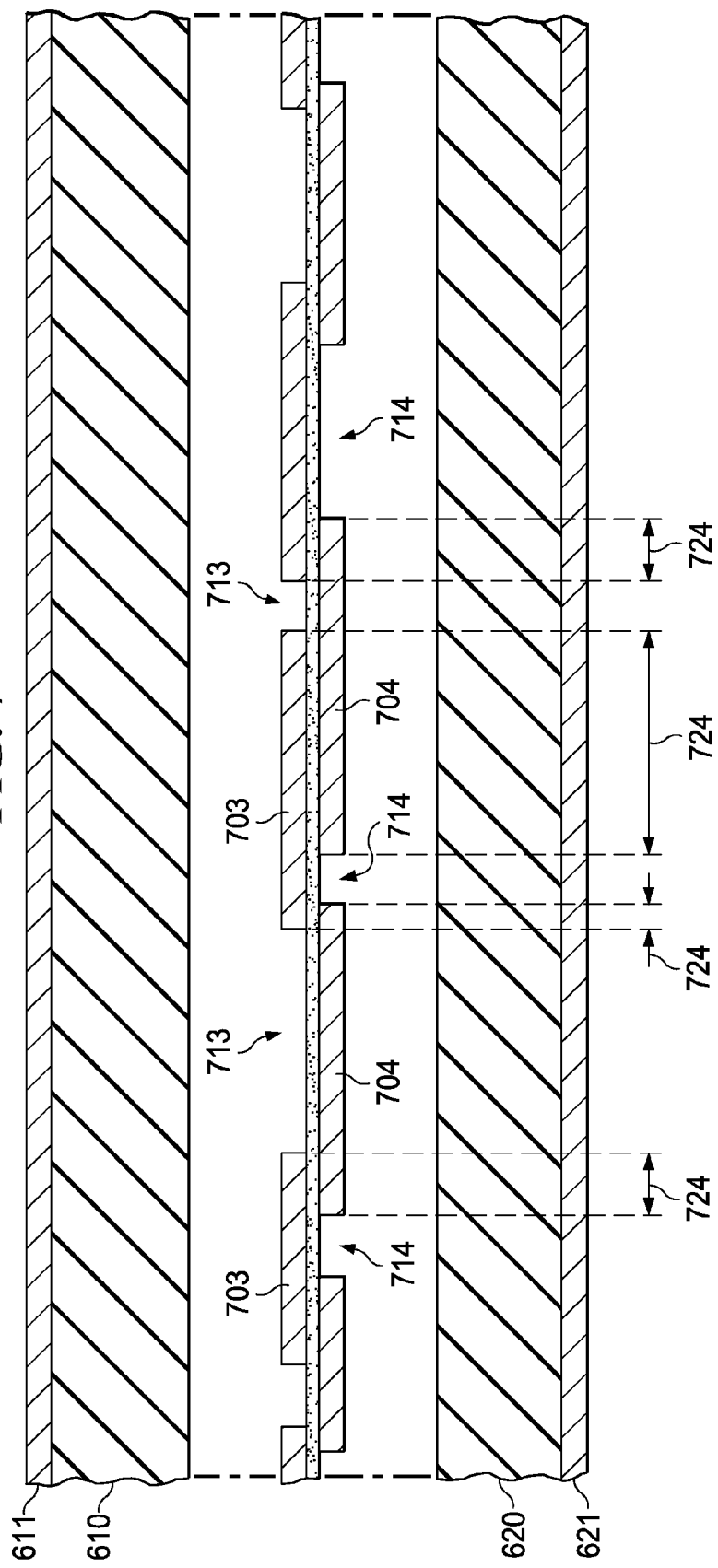

Referring now to FIG. 7, in the next process steps, the first and second metal layers are patterned in a photolithographic process. The first metal 603 layer is etched to create first metal traces 703, which are separated by first gaps 713. The second metal layer 604 is etched to create second metal traces 704, separated by second gaps 714. The traces are so designed that the second traces 704 extend across the first gaps 713 and partially overlap with portions of the first traces 703. These overlap areas are designated 724 in FIG. 7; they are the locations for the conductivity switches of the non-linear sheet with the areas.

In the next process step, shown in FIG. 6, a first insulator foil 610 is provided, which is plated with a third metal layer 611. The insulator material may be epoxy glass, ABF, or related compounds, and is preferably between about 20 and 60 µm thick. Metal layer 611 is preferably copper between about 25 and 100 µm thick. In FIG. 7, first foil 611 is shown just before being placed on the first traces 703, with the third metal layer 611 facing outwardly.

A second insulator foil 620 is also provided, which is plated with a fourth metal layer 621. The insulator is preferably a material like epoxy glass or ABF and has a thickness in the range from about 25 to 100 µm. In FIG. 7, second foil 620 is shown just before being placed on the second traces 704, with the fourth metal layer 621 facing outwardly.

Figure 8:
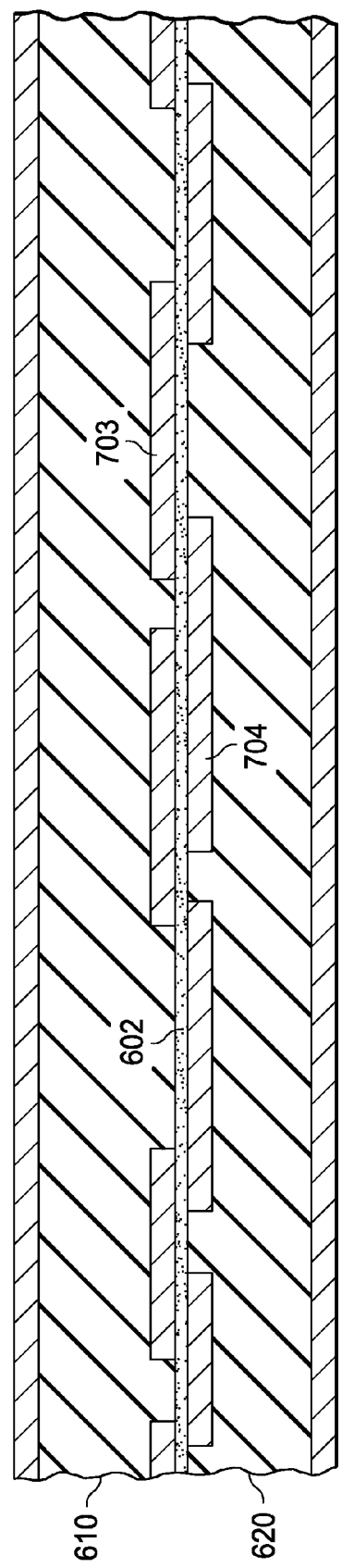

In the next process step, illustrated in FIG. 8, the insulators 610 and 620 are laminated unto the metal traces 703 and 704, respectively. In this process, the gaps 713 between traces 703 and gaps 714 between traces 704 are filled with the insulating material. As a result of the step, a substrate 801 is formed, which has a flat sheet 602 of non-linear material with partially overlapping metal traces 703 and 704 sandwiched between the insulator 610 and 620, wherein the non-linear material sheet extends throughout the length and width of the tape. The substrate offers, after completing the following process steps, a plurality of sites for the assembly of components into a series of repetitive devices.

Figure 9:
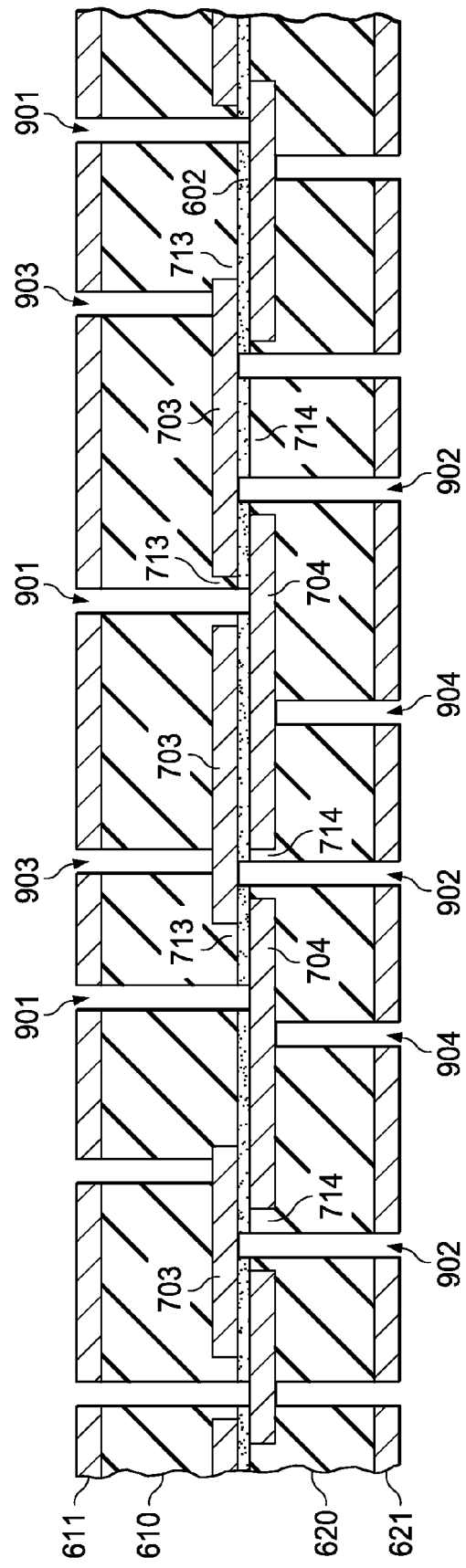

In FIG. 9 results of further process steps are depicted, in which through-holes in the substrate are opened to provide connections to the embedded metal traces. A preferred method of opening the through-holes is laser drilling; alternatively, plasma etching or any suitable drilling technique (such as mechanical) may be employed. The preferred diameter of the through-holes is between about 3 and 10 µm—the small size can provide a high density, fine-pitch center-to-center array of through-holes.

To facilitate the description of the function of the through-holes, they are grouped in sets. The first set of through-holes is designated 901; they are aligned with the first gaps 713 (see also FIG. 7). Through-holes 901 extend through the metal layer 611, the insulator foil 610, the insulator-filled gaps 713, and the sheet 602 of non-linear material; terminate at the metal traces 704. Consequently, first through-holes 901 perforate sheet 602 with a first set of through-holes.

The second set of through-holes are designated 902; the through-holes are aligned with the second gaps 714 (see also FIG. 7). Through-holes 902 extend through the metal layer 611, the insulator foil 620, the insulator-filled gaps 714, and the sheet 602 of non-linear material; and terminate at the metal traces 703. Consequently, second through-holes 902 perforate sheet 602 with a second set of through-holes.

FIG. 3 depicts a functional sheet 602 with the combined first and second sets of through-holes.

The third set of through-holes is designated 903. They extend through metal layer 611 and insulator foil 610, and terminate at the metal traces 703.

The fourth set of through-holes is designated 904. They extend through metal layer 621 and insulator foil 620, and terminate at the metal traces 704.

Figure 10:
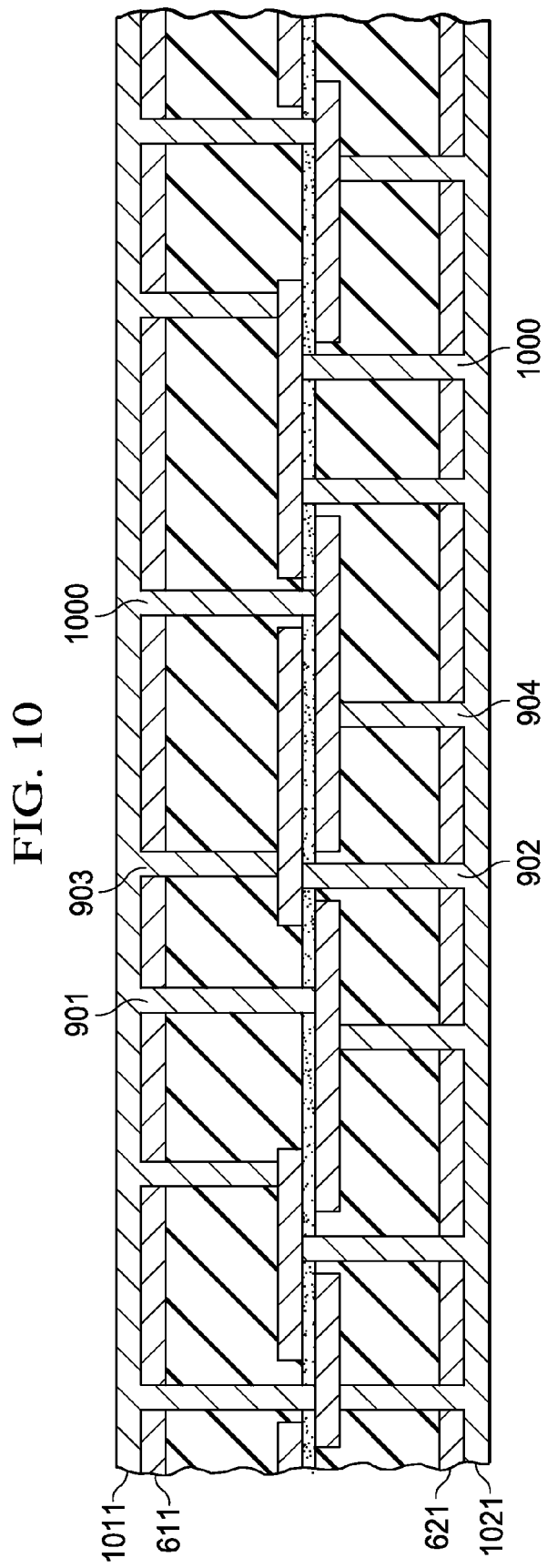

In the next process step, depicted in FIG. 10, the through-holes are filled with metal, preferably copper. As FIG. 10 shows, metal 1000 is deposited to fill the through-holes of the sets 901, 902, 903, and 904, and, in the same process, to add a continuous (fifth) metal layer 1011 on top of the (third) metal layer 611, and a continuous (sixth) metal layer 1021 on top of the (fourth) metal layer 621. In some embodiments, where the deposited metal (1011, 1021) has the same composition as the metal (611, 621) laminated on the insulator foils, layer 611 together with layer 1011, and layer 621 together with layer 1021 become metal layers of uniform composition, as depicted in FIG. 2. In other embodiments, though, the metal layers maintain their individual characteristics, as the shading of FIG. 10 suggests.

The preferred method of depositing metal is plating. Many embodiments add process steps after the deposition, which prepare the surface of metal 1011 to facilitate the later process of attaching solder bodies. For example, one may add thin layers of nickel or nickel and palladium on copper, or attach wire bonds. Further, it is convenient for many embodiments, to add process steps to prepare the surface of metal 1021 to facilitate the later process of attaching solder bodies.

Figure 11:
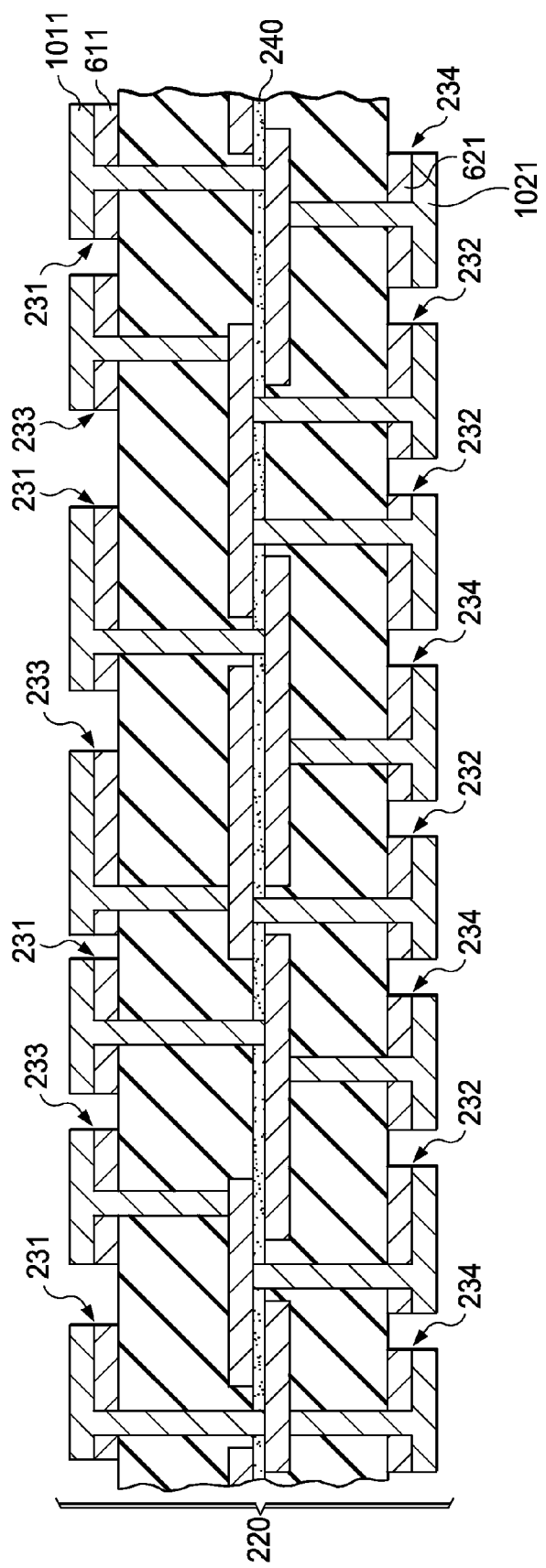

In the process step depicted in FIG. 11, the metal layers 1011 and 611, and the layers 1021 and 621, are patterned to create terminals for the respective metal-filled through-holes. The terminals to be formed from layers 1011 and 611 are destined to be connected to the electrodes of that electrical component, which needs to be protected against overcharge events. The terminals to be formed from layers 1021 and 621 are destined to be connected to external signal, power, and ground; they are thus referred to as "external" terminals. Preferred patterning techniques include etching by plasma and by chemical processes. The patterned terminals are grouped in sets according to the sets, to which the respective metal-filled through-holes belong, which the terminals serve.

The terminals patterned from the metal layers 1011 and 611, which are connected to a through-hole of the first set (extending through the member 240), represent a first set. In FIG. 11, they are designated 231 in accordance with the designations of FIG. 2.

The terminals patterned from the metal layers 1011 and 611, which are connected to a through-hole of the third set (not extending through the member 240), represent a third set. In FIG. 11, they are designated 233 in accordance with the designations of FIG. 2.

The terminals patterned from the metal layers 1021 and 621, which are connected to a through-hole of the second set (extending through the member 240), represent a second set. In FIG. 11, they are designated 232 in accordance with the designations of FIG. 2.

The terminals patterned from the metal layers 1021 and 621, which are connected to a through-hole of the fourth set (not extending through the member 240), represent a fourth set. In FIG. 11, they are designated 234 in accordance with the designations of FIG. 2. The pattering of the terminals completes the fabrication of substrate 220.

Figure 12:
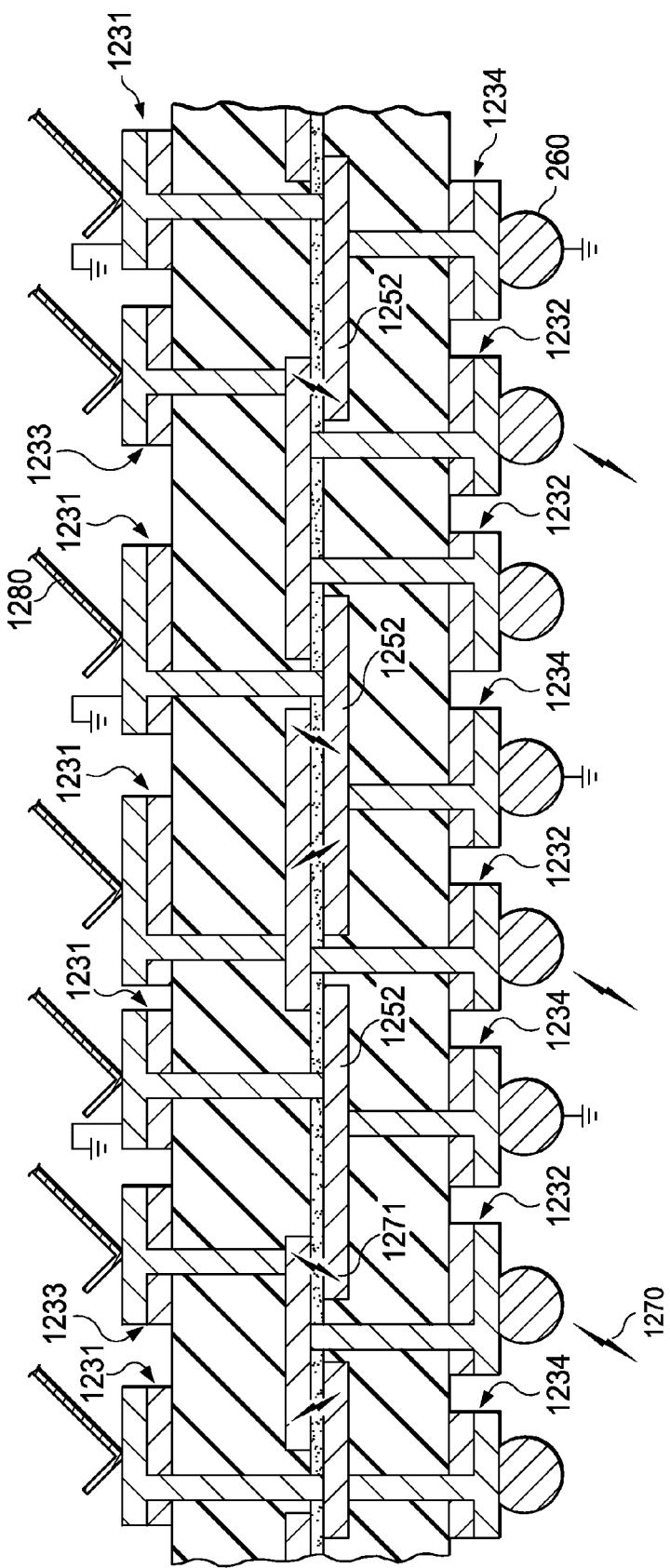

As depicted in FIG. 12, certain second traces 1252 and their respective fourth set terminals 1234 and first set terminals 1231 are selected for connection to electrical ground. The remaining second traces and the first traces, together with their respective terminals (of the fourth set 1234, second set 1232, first set 1231, and third set 1233) are selected for connection to electrical signal and power.

As a result of the selections, any overcharge (symbolized by lightning signs 1270) hitting an external substrate terminal for signal/power switches the sheet of non-linear material locally from insulator to conductor mode (symbolized by lightning signs 1271) and is discharged to ground after traveling along a short and localized path of only few mΩ resistance.

In the next process step, a plurality of electronic components is provided, such as semiconductor chip 201 in FIG. 2. A component has electrodes 202 for electrical signal and power, and electrodes 203 for electrical ground (see FIG. 2). The component electrodes 202 are connected to the site terminals selected for signal and power using solder bodies 210 as shown in FIG. 2; or bonding wires 1280 as shown in FIG. 12. The component electrodes 203 are connected to the respective site terminals selected for ground, again using solder bodies 210 as shown in FIG. 2 or bonding wires 1280 as shown in FIG. 12.

The connecting steps are repeated for each component, until the assembly of each component on a respective substrate site is completed.

For embodiments with bonding wires it is preferred to protect the wire-assembled component in encapsulation compound, preferably using a molding technology.

It is preferred for many embodiments to add solder bodies 260 onto the external substrate terminals; see FIG. 12. Alternatively, terminals 1232 and 1234 may be used as pressure contacts for connecting to external parts, since the terminals are flat and positioned in a plane.

Finally, the tape with the assembled components is singulated into discrete devices. A preferred technique is sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the component may be a single semiconductor chip or a stack of chips; the component may belong to a particular product family, such as memory, or it may include a composite functionality.

As another example, the insulator material of the substrate, thin as it generally is, may be more or less flexible, even stiff. As yet another example, the pitch center-to-center of the metal-filled through-holes can be reduced so that the invention is effective for many semiconductor device technology nodes and is not restricted to a particular one. It is therefore intended that the appended claims encompass any such modifications or embodiments.

We claim:

1. A device comprising:
   an electronic component having first electrodes for electrical signal and power, and second electrodes for electrical ground;
   a substrate, onto which the component is assembled, having built-in local protection shortcuts for the first electrodes operable to bypass electrical overcharge events directly to ground, the substrate including:
      an insulator material having a top surface with a first set and a third set of terminals, and a bottom surface with a second set and a fourth set of terminals;
      a flat sheet-like sieve member sandwiched in the insulator having a first surface and a second surface, the sieve member made of a non-linear material that switches from insulator to conductor mode at a preset voltage, the member perforated with a first set and a second set of through-holes and otherwise being free of indentations on its surfaces; and;
      first metal traces over the first surface, each first trace positioned covering a first set through-hole and having a conductive connection to a third set terminal and a conductive connection to a second set terminal;
      second metal traces on the second surface, each second trace covering a second set through-hole and overlapping a first trace, the overlap areas constituting a conductivity switch, and the second metal traces further having a conductive connection to a fourth set terminal and a conductive connection to a first set terminal; and
   the first and second electrodes connected to the first and third set terminals so that each first electrode is connected to a switch built into the substrate.

2. The device of claim 1 wherein the fourth set terminals are connected to external electrical ground.

3. The device of claim 1 wherein the sheet-like sieve member has a thickness between about 3 and 10 μm, which controls the voltage for the onset of the conductive mode from the insulating mode of the non-linear material.

4. The device of claim 1 wherein the electronic component is an integrated circuit chip.

5. The device of claim 1 wherein the insulator material of the substrate is made of an epoxy-based compound.

6. The device of claim 1 wherein the terminals and metal traces are made of copper.

7. The device of claim 1 wherein the electrodes are connected to the terminals by solder bodies.

8. The device of claim 1 wherein the electrodes are connected to the terminals by bonding wires.

9. The device of claim 8 further having an encapsulation compound covering the component and the bonding wires.

10. The device of claim 1 wherein the switches have an electrical resistance between about 2 and 20 mΩ.

11. A method for fabricating a semiconductor device, comprising the steps of:
   providing a tape having a length and a width including a sheet of non-linear material sandwiched between a first and a second metal layer,
   the sheet being capable of switching from insulator to conductor mode at a preset voltage, extending over the entire tape length and width and being without indentations or grooves on its surfaces;
   patterning the first metal layer to create first metal traces separated by first gaps;
   patterning the second metal layer to create second metal traces separated by second gaps and overlapping portions of the first traces;
   providing a first insulator foil laminated with a third metal layer;
   placing the first foil on the first traces, the third metal layer facing outwardly;
   providing a second insulator foil laminated with a fourth metal layer;
   placing the second foil on the second traces, the fourth metal layer facing outwardly;
   laminating the insulators of each foil unto the respective traces and filling the gaps between the traces with insulating material, thereby creating the tape-like substrate having sites for a series of repetitive devices;
   opening a first set of through-holes, aligned with the first gaps, extending through the third metal layer, the first insulator foil, the insulator-filled gaps, and the sheet of non-linear material, thereby perforating the sheet with a first set of through-holes terminating at the second metal traces;

opening a second set of through-holes, aligned with the second gaps, extending through the fourth metal layer, the second insulator foil, the insulator-filled gaps, and the sheet of non-linear material, thereby perforating the sheet with a second set of through-holes terminating at the first metal traces;

opening a third set of through-holes extending through the third metal layer and first insulator foil, terminating at the first metal traces;

opening a fourth set of through-holes extending through the fourth metal layer and second insulator foil, terminating at the second metal traces;

depositing metal to fill the through-holes and to add a continuous fifth metal layer on top of the third metal layer and a continuous sixth metal layer on top of the fourth metal layer;

patterning the fifth and third metal layers to create terminals connected to a respective metal-filled through-hole, wherein terminals connected to a first set through-hole represent a first set, and terminals connected to a second set through-hole represent a second set;

patterning the sixth and fourth metal layers to create terminals connected to a respective metal-filled through-hole, wherein terminals connected to a third set through-hole represent a third set, and terminals connected to a fourth set through-hole represent a fourth set;

selecting certain second traces and the respective fourth and first set terminals for connection to electrical ground;

selecting certain second traces, the first traces, and the respective terminals of the fourth, first, second, and third sets for connection for electrical signal or power;

providing a plurality of electronic components having first electrodes for electrical signal and power, and second electrodes for electrical ground;

connecting the first electrodes to the terminals of the respective substrate site for signal and power;

connecting the second electrodes of the component to the terminals of the respective substrate site for ground;

repeating the connecting steps for each component to assemble the component to the respective substrate site; and singulating the tape with the assembled components into discrete devices.

12. The method of claim 11 further including the steps of connecting the fourth set terminals selected for ground to external ground, and connecting the fourth and second set terminals selected for signal and power to external signal and power supplies.

13. The method of claim 11 wherein the non-linear material comprises an insulating polymer compound embedded with nanometer-size conducting particles, the material switching from insulator to conductor mode at a preset voltage.

14. The method of claim 11 wherein all metal layers, and the metal filling the through-holes are copper.

15. The method of claim 11 wherein the first and second insulator foils are made of an epoxy-based compound.

16. The method of claim 11 further including, after the step of depositing metal, the steps of:
preparing the fifth metal sheet to facilitate the process of attaching wire bonds or the process of attaching flip-chip bumps; and
preparing the sixth metal sheet to facilitate the process of attaching solder bodies.

17. The method of claim 11 wherein the step of connecting the electrodes to the terminals employs a wire bonding technique.

18. The method of claim 17 further including the step of covering the component and the wire bonds with an encapsulation compound.

19. The method of claim 11 wherein the step of connecting the electrodes to the terminals employs a flip-chip technique using metal bumps.

20. The method of claim 11 further including the step of attaching solder balls to the terminals of the third and fourth sets.

* * * * *